(12) United States Patent
Chang et al.

(10) Patent No.: US 6,538,868 B2
(45) Date of Patent: Mar. 25, 2003

(54) ELECTROSTATIC DISCHARGE PROTECTIVE CIRCUIT

(75) Inventors: Hung-Yi Chang, Hsinchu (TW); Yi-Hua Chang, Hsinchu Hsien (TW); Chih-Fu Chien, Taipei (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/236,821

(22) Filed: Sep. 6, 2002

(65) Prior Publication Data

US 2003/0007298 A1 Jan. 9, 2003

Related U.S. Application Data

(62) Division of application No. 09/895,551, filed on Jun. 28, 2001, now Pat. No. 6,469,560.

(51) Int. Cl.[7] .............................. H02H 9/00; H02H 3/22
(52) U.S. Cl. ...................... 361/111; 361/56; 327/318
(58) Field of Search ........... 361/111, 56; 327/309–310, 327/318

(56) References Cited

U.S. PATENT DOCUMENTS 5,239,440 A * 8/1993 Merrill ........................ 361/56
5,671,111 A * 9/1997 Chen ........................... 361/56
5,721,656 A * 2/1998 Wu et al. ..................... 361/56
5,986,867 A * 11/1999 Duvvury et al. ............ 361/111

* cited by examiner

Primary Examiner—Kim Huynh
(74) Attorney, Agent, or Firm—J.C. Patents

(57) ABSTRACT

An electrostatic discharge protective circuit can receive a pre-stage driver output and involve a first PMOS transistor, a first NMOS transistor and a second NMOS transistor and all connect in series. More particularly, a source region of the first PMOS transistor connects to a system power source; and a drain region connects to a conductive pad, and a gate receives the pre-stage driver output. A gate of the first NMOS transistor connects to a first node A, a gate of the second NMOS transistor connects to a third node C and a source region connects to a grounded node. The third node C also can receive the pre-stage driver output. There is a first resistor between the first node A and the system power source. There is a second PMOS transistor in between the first node A and the third node C and connect with two source/drain regions. And the substrate of the second PMOS transistor also connects with the first node A. Also, a gate of the second PMOS transistor connects with a second node B. There is a second resistor between the second node B and the system power source, and there is a capacitor between the second node B and the grounded node.

5 Claims, 7 Drawing Sheets

ELECTROSTATIC DISCHARGE PROTECTIVE CIRCUIT

CROSS-REFERENCE TO RELATED APPLICATION

This application is a divisional application of, and claims the priority benefit of, U.S. application Ser. No. 09/895,551 filed on Jun. 28, 2001 now U.S. Pat. No. 6,469,560.

BACKGROUND OF THE INVENTION

1. Field of Invention

The present invention relates to an electric circuit. More particularly, the present invention relates to an electrostatic discharge (ESD) protective circuit.

2. Description of Related Art

In the integrated circuit (IC), the electrostatic discharge is the major damage in the process of the dynamic random access memory (DRAM) and the statistic random access memory (SRAM) or after complete the wafer process. Therefore, an electrostatic discharge protective circuit usually is designed on the circuit and avoids the electrostatic from outside medium. For example, the human body walks on the carpet and carries approximately few hundreds or thousands electrostatic voltage in the status of higher relativity humidity (RH). However, the human body also carries approximately over ten thousands volt of the electrostatic voltage in the status of lower relativity humidity. When those electrified body touches the wafer and the wafer is losing its efficiency by the electrostatic discharge. Nowadays, the electrostatic discharge is the most serious problem in the fabrication of the complementary metaloxide semiconductor (CMOS).

Therefore, there are various kind method that is designed to avoid the wafer damage by the electrostatic discharging. The most common conventional method is utilizing the hardware to avoid the electrostatic discharging, which is designed and protected the internal circuit on an electrostatic discharge protective circuit between the internal circuit and every bonding pad. Currently, the electrostatic discharge problem is the most malfunction cases on the deep submicro, or on the even smaller integrated circuit. Therefore, a method for improving the efficiency of the electrostatic discharge protective circuit is greatly intended by the manufacturers.

FIG. 1 through FIG. 3 show three conventional designs of the electrostatic discharge protective circuit. Referring to FIG. 1, the electrostatic discharge protective circuit, which is used in an overvoltage tolerant output buffer, connects in series with a P-type metal-oxide semiconductor (PMOS) transistor 42, two N-type metal-oxide semiconductor (NMOS) transistors 44 and 46. The drain regions of the NMOS transistor 44 and the PMOS transistor 42 are connected to a bonding pad 52. A source region of the PMOS transistor 42 connects to a system power source. A source region of the NMOS transistor 46 connects to a grounded node. The gates of the PMOS transistor 42 and the NMOS transistor 46 can receive the output of a pre-stage driver 50. Therefore, the gate of the NMOS transistor 46 is turned on. Also, and the gate of NMOS transistor 44 connects to the system power source, wherein since the gate of NMOS transistor 44 is connected to the system power source, it can maintain a stable voltage to avoid a high voltage on the NMOS transistor 46. For example, a 5 volts voltage can cause an issue of poor reliability. The bonding pad 52 can be connected to a signal with a voltage greater than Vcc. The NMOS transistor 46 is usually operated at 3.3 volts.

FIG. 1 shows a circuit design using an output buffer as the electrostatic discharge protective circuit, which is used in an overvoltage tolerant output buffer.

FIG. 2 shows the conventional design of the electrostatic discharge protective circuit. It is a similar design as like FIG. 1, but used in an overvoltage tolerant input buffer. Here, a gate electrode of the PMOS transistor 42 is connected to a well control circuit, and gate electrode of the NMOS transistor 46 connects to the grounded node.

Moreover, FIG. 3 shows the electrostatic discharge protective circuit used in a conventional non-overvoltage tolerant input buffer, where the design includes two sets of protective circuit, and connected in parallel. Because effects of the parasitic capacitance 60 and diode of the MOS transistor, it also can conduct the electrostatic charges to the grounded node or the power source. In the foregoing description of the conventional design of the electrostatic discharge protective circuit, all the protective ability is either insufficient or not being used in the overvoltage tolerant input/output buffer.

SUMMARY OF THE INVENTION

The invention provides electrostatic discharge protective circuit, that includes a first PMOS transistor, a first NMOS transistor and a second NMOS transistor and they all connect in series. More particularly, the first PMOS transistor of a source region connects to a system power source, and a drain region connects to a conductive pad, and a gate receives output of the pre-stage driver, and the base is connected to the well control circuit. A gate of the first NMOS transistor connects to a first node A. A gate of the second NMOS transistor connects to a third node C, and one source region connects to a grounded node. The third node C also can receive output of the pre-stage driver. There is a first resistor in between the first node A and the system power source. There is a second PMOS transistor in between the first node A and the third node C. The source region connects to the node A and the drain regions connects to node C., and the substrate of the second PMOS transistor also connects to the first node A. Moreover, a gate of the second PMOS transistor connects to a second node B. There is a second resistor that connected between the second node B and the system power source, and there is a capacitor that connects between the second node B and the grounded node.

In the foregoing descriptions, when an electrostatic pulse enters through the conductive pad, because the second NMOS transistor has the equivalence capacitor, the voltage of the first node A rises. Also and, because the capacitor exists between the second node B and the grounded node, and the second node B voltage is equal to zero. Then the voltage of the third node C rises up, because the second PMOS transistor is turned on. As a result, the electrostatic pulse entering from the conductive pad can lead the electrostatic pulse to the grounded node through the first and the second NMOS transistors connected in series.

The invention also provides an electrostatic protective circuit. It can protect an internal circuit, comprising a first P-type metal-oxide semiconductor (PMOS) transistor, a first N-type metal-oxide semiconductor (NMOS) transistor, and a second NMOS transistor and they all connected in series. More particularly the first PMOS transistor of a source region, a gate electrode, and a drain regionrespectively connect to a system power source, a well control circuit, and a conductive pad, and the conductive pad is connected to the input buffer 58. A gate of the first NMOS transistor connects to the first node A. A gate of the second NMOS transistor connects to a third node C. Source/drain regions of the second NMOS transistor respectively connects to a grounded node and the third node C. Also it includes a first resistor that connected between the first node A and the system power source. A second PMOS transistor is connected between the first node A and the third node C, where a substrate of the second PMOS transistor is also connected to the first node A, and a gate of the second PMOS transistor is connected to a second node B. A second resistor connects in between the second mode B and the system power source. A capacitor is connected between the second node B and the grounded node. A third NMOS transistor has a gate electrode, a source region, a drain region, respectively connected to the third node C, the grounded node, and the second node B.

In the foregoing, when an electrostatic pulse entries from the conductive pad, because the second NMOS transistor has the equivalent capacitor, the voltage of the first node A rises up. Also and, because the capacitor connected between the second node B and the grounded node and the voltage of second node B is equal to zero. Therefore the second PMOS transistor between the first node A and the third node C is turned on. Then, the third node C voltage rises up, and thereby the second NMOS transistor is also turned on. However, the third NMOS transistor maintains at the "OFF" state. Thereby, the voltage of the third node C rises up and it turns on the second NMOS transistor. As a result, it entries from the electrostatic pulse entering from the conductive pad and can be connected to the grounded node. The first and second NMOS transistors connected in series.

In the forgoing descriptions, the resistor forms by a PMOS resistor. More particularly, the gate connects to the grounded node, and the substrate connects to the power source.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The electrostatic discharge protective circuit of the invention allows the electrostatic pulse to be effectively conducted to the grounded node. A few of examples are provided for explanation more in this invention.

Figure 1:
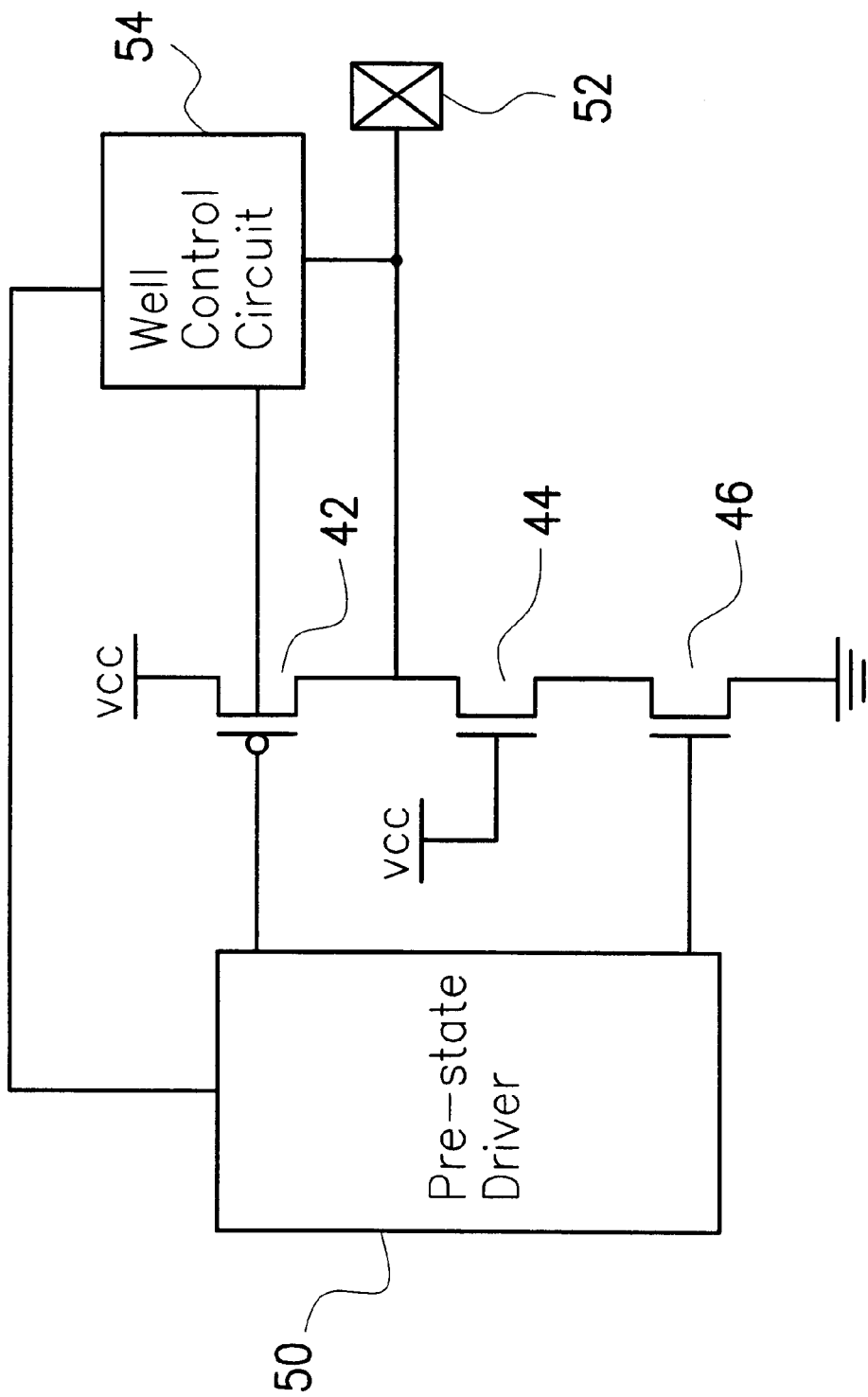
FIG. 1 through FIG. 3 are illustrating three conventional design of the electrostatic discharge protective circuit.
Figure 2:
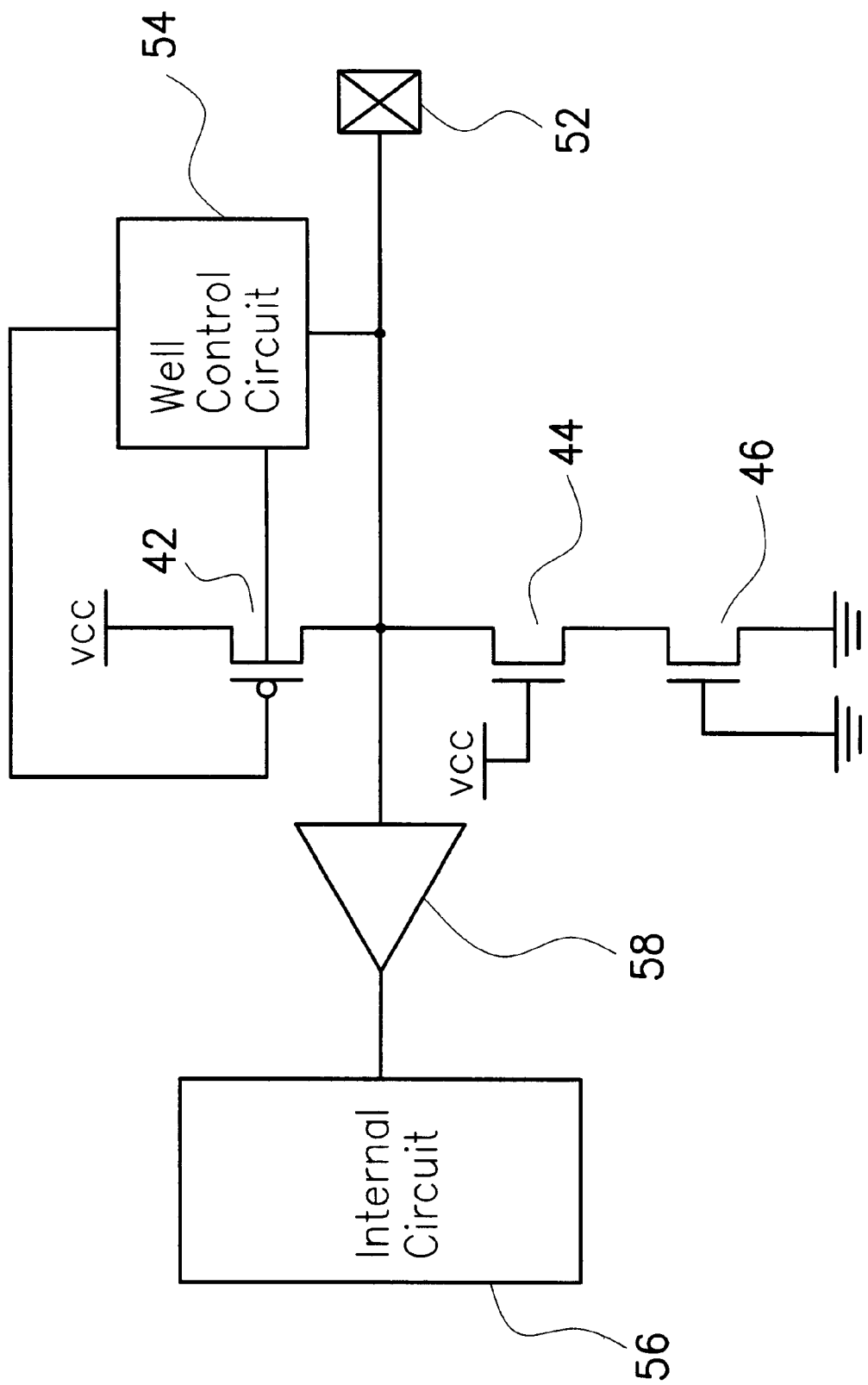
Figure 3:
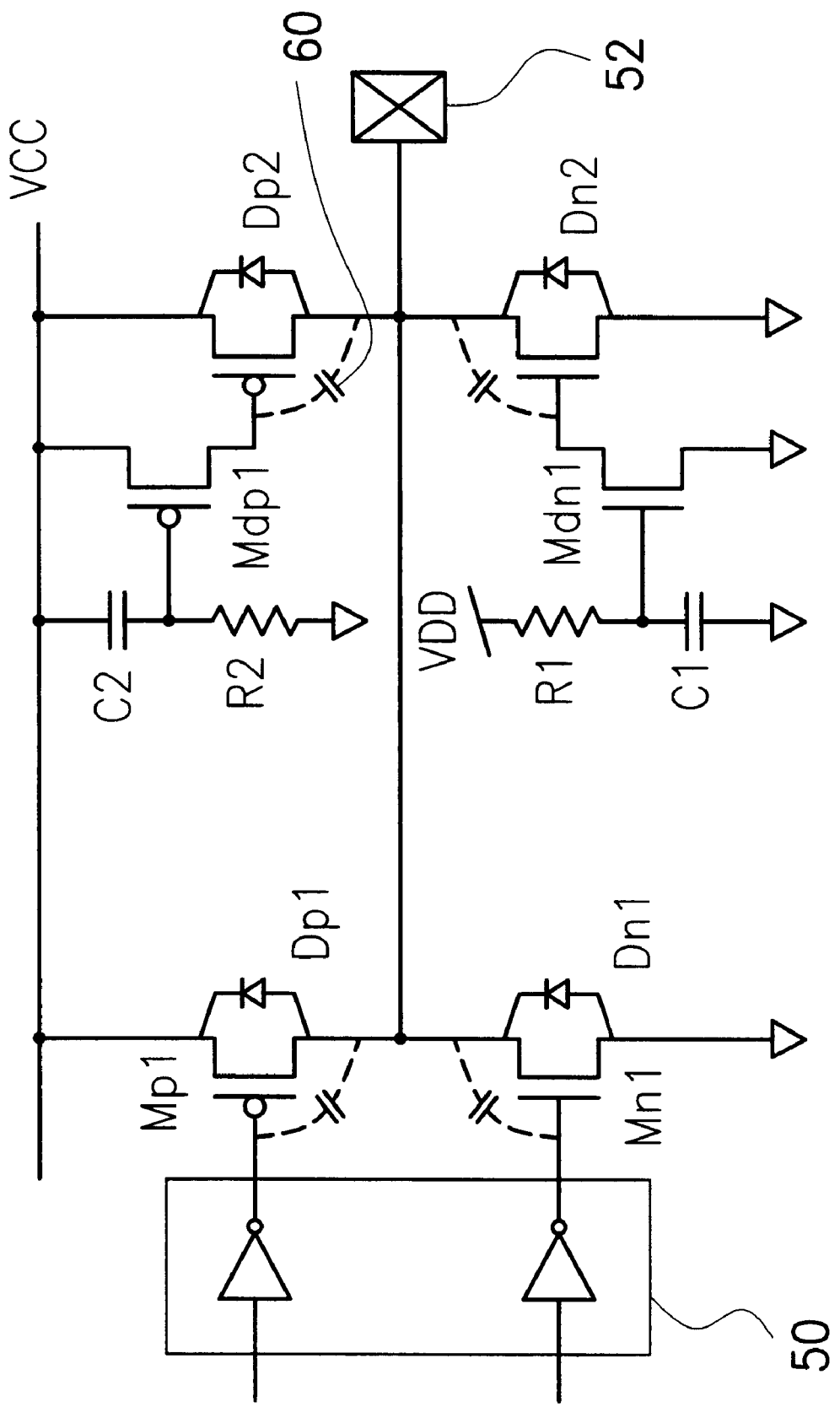
Figure 4:
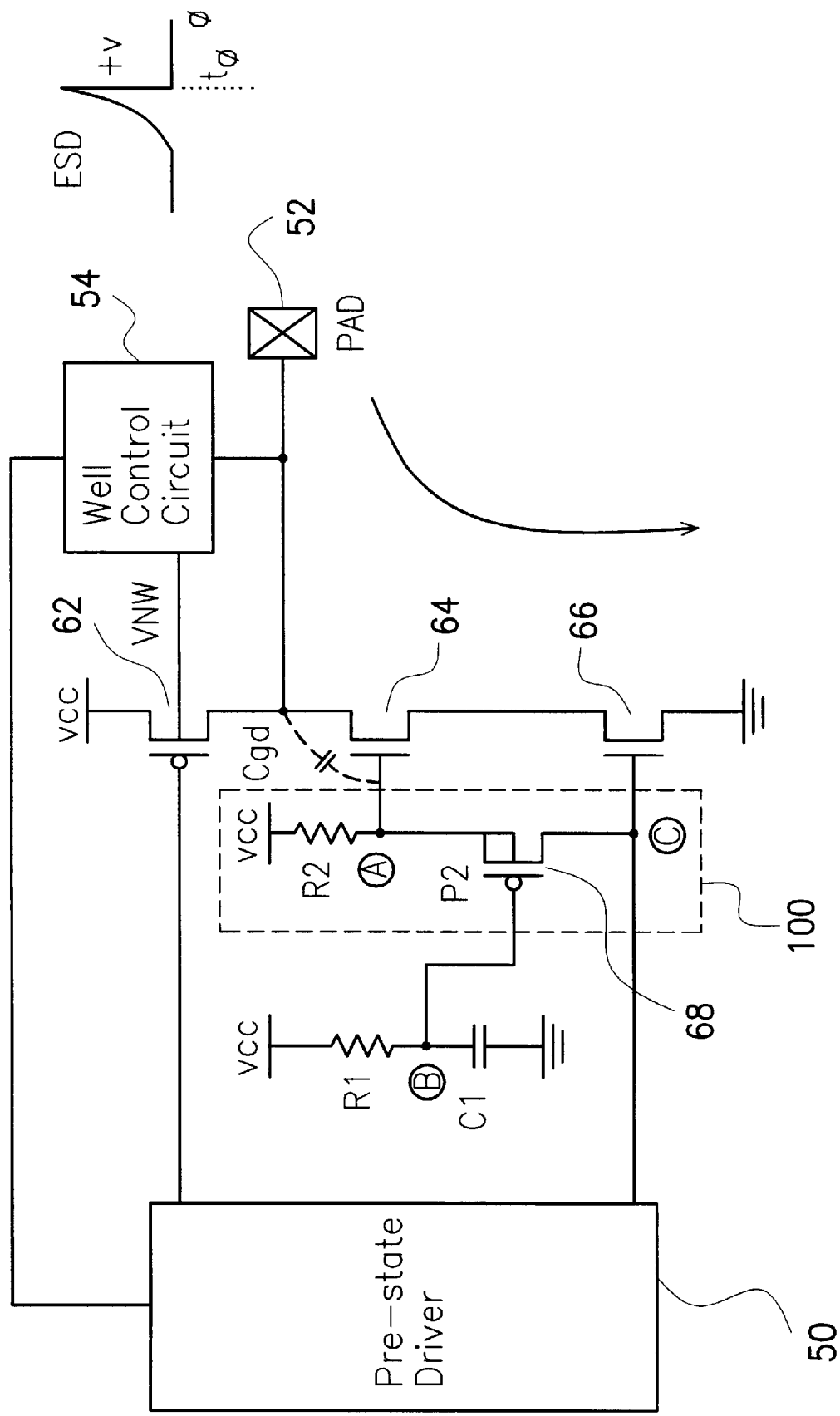
FIG. 4 is illustrating an ESD circuit, it is for the output buffer to protect the prestage driver, according to one preferred embodiment of this invention.

First, the circuit structure is described. In FIG. 4, the invention shows an output buffer serving as an electrostatic discharge protective circuit. In the FIG. 4, the electrostatic discharge protective circuit includes a PMOS transistor 62, a NMOS transistor 64, and NMOS transistor 66, and those three MOS transistors connect in series. A source region of the PMOS transistor 62 connects to a system power source Vcc, and drain region connects to a conductive pad 52, and a gate receives the output of a pre-stage driver 50. Also, a well control circuit 54 also respectively connects to the substrate of the PMOS transistor, the conductive pad 52, and the pre-stage driver 50.

The NMOS transistor 64 and PMOS transistor 62 connect a source/drain region in series and they also connect to the conductive pad 52. The gate of the NMOS transistor 64 connected to a node A. Another source/drain region of the NMOS transistor 64 and the NMOS transistor 66 connects in series. The source region of the NMOS transistor 66 connects to the grounded node and the gate connects to a node C. The node C also receives output of another pre-stage driver 50.

For more efficiency to control this PMOS transistor 62, the NMOS transistor 64 and the NMOS transistor 66, where the design adds a protective circuit 100 in between the node A and the node C. Therefore, the electrostatic pulse can conduct more efficiency to the grounded node. The protective circuit 100 includes a PMOS transistor 68 connected between the node A and the node C. The node A is a source/drain region of the PMOS transistor 68 and it connects to the resistor R2 and the system power source Vcc. A gate of the PMOS transistor 68 connects to a node B. The substrate of the PMOS transistor 68 connects to a node B. The substrate of the PMOS transistor 68 also connects to the node A. There is a resistor R1 connected between the node B and the system power source Vcc, and there is a capacitor C1 connects between the node B and the grounded node.

In the foregoing descriptions, here describes how the electrostatic pulse conducts the electrostatic discharge to the grounded node and protects the circuit. For example in the primary state, the electrical potentials of the nodes A, B, and C are all equal to zero. When an electrostatic pulse suddenly conducts to the conductive pad 52, there is an equivalent parasitic capacity Cgd between the drain region and the gate of the NMOS transistor 64 and the voltage of the node A rise up. Therefore, the capacitor C1 is existed and the voltage of node B becomes zero. Therefore, the PMOS transistor 66 is turned "ON". At this moment, the electrostatic pulse can conduct to the grounded.

Figure 5:
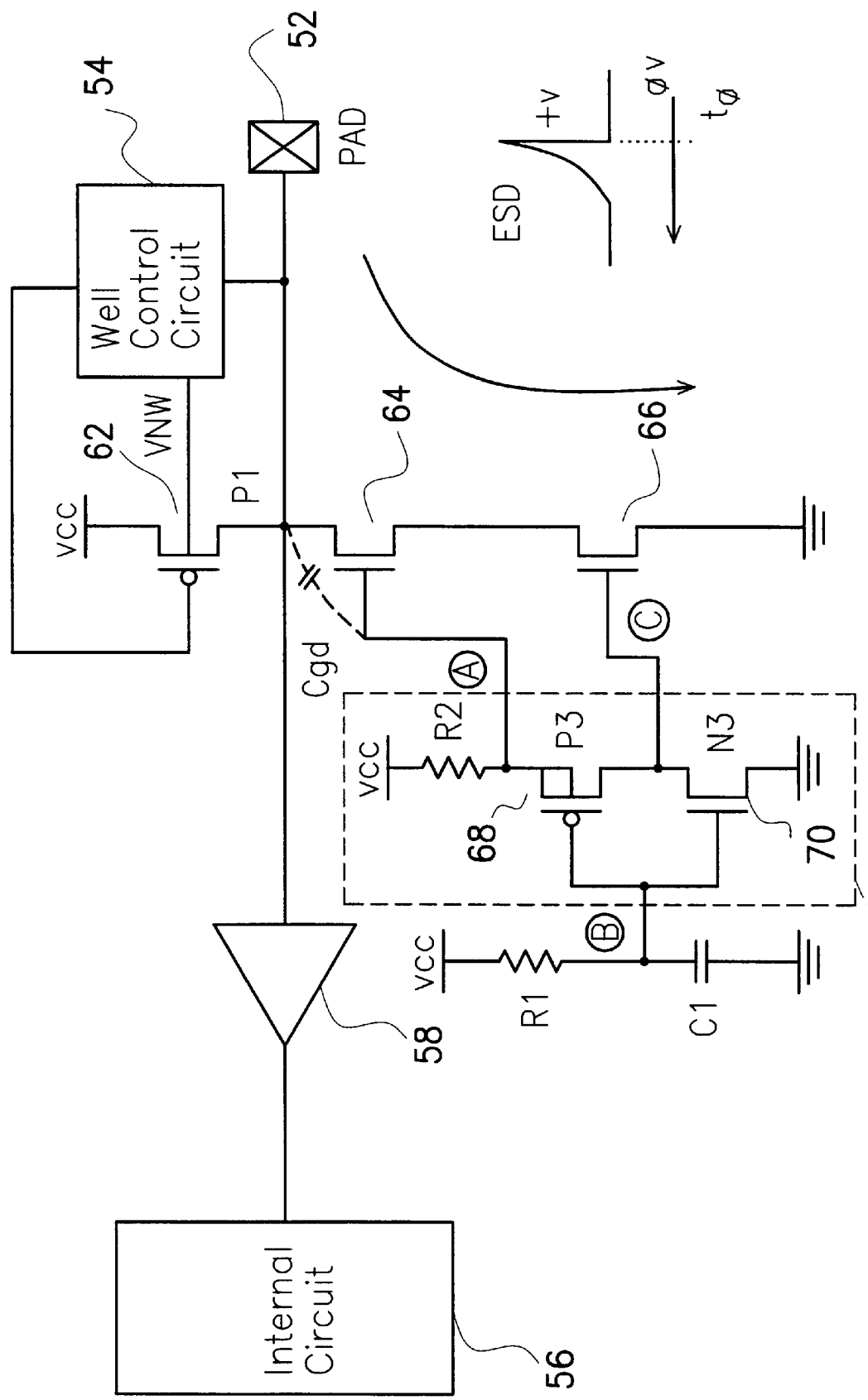
FIG. 5 is illustrating an ESD circuit, it is for the input buffer to protect the internal circuit, according to one preferred embodiment of this invention.

Follow by this similar idea, the electrostatic discharge protective circuit can also apply to the input of the buffer. The FIG. 5 shows an electrostatic discharge protective circuit that is for protecting the internal circuit. In FIG. 5, the PMOS transistor 62, the NMOS transistor 64, and the NMOS transistor 66 still link in series. The gate of the PMOS transistor 62 can be connected to the well control circuit 54. Two gates of the NMOS transistor 64 and the NMOS transistor 62 connect to the node A and the node B respectively. The Conductive pad 52 connected from the nodes between the NMOS transistor 64 and the PMOS transistor 62, and conduct into the internal circuit 56.

For the outputting operational mode, the protective loop circuit 102 includes a PMOS transistor 68, a NMOS transistor 70, and a resistor R2. The resistor R2 connected between the system voltage and the node A. Two source/ drain regions of the PMOS transistor 68 connect between the node A and the node C. The substrate of the PMOS transistor 68 also connects to the node A. Another source/drain region of the NMOS transistor 70 connects to the grounded. Two gates of the PMOS transistor 68 and the NMOS transistor 70 connect to the node B. And there is a resistor R1 between the node B and the system voltage, and there is a capacitor C1 connected between the node B and the grounded node.

FIG. 5 is the circuit structure and shows the electrostatic discharge mechanism. When an electrostatic pulse entries from the conductive pad 52, because the NMOS transistor 64 process the equivalence capacity Cgd, and the voltage of the node A rises up. And because there is a capacitor C1 between the node B and the grounded node, and the voltage of the node B is equal zero. Therefore, it turns "ON" the PMOS transistor 68 between the node A and the node C. Also and, the voltage of the node C rises up, therefore the NMOS transistor 66 also turns "ON". But the NMOS transistor 70 maintains "OFF" state. Now, the voltage of node C rises up and is turned "ON" the NMOS transistor 66, then the conductor 52 entries the electrostatic pulse can conduct from the NMOS transistors 64 and 66 in series and leads the electrostatic pulse to the grounded.

In the foregoing, of this invention added a protective circuit 100 and 102. There is a validly effect the electrostatic pulse that conducts to the grounded node. The circuits in the FIGS. 4 and 5 can do some correction without change the main character of this invention. A normal resister also can make by the semiconductor process, wherein when the other device made by the MOS and can also create the resistance.

Figure 6:
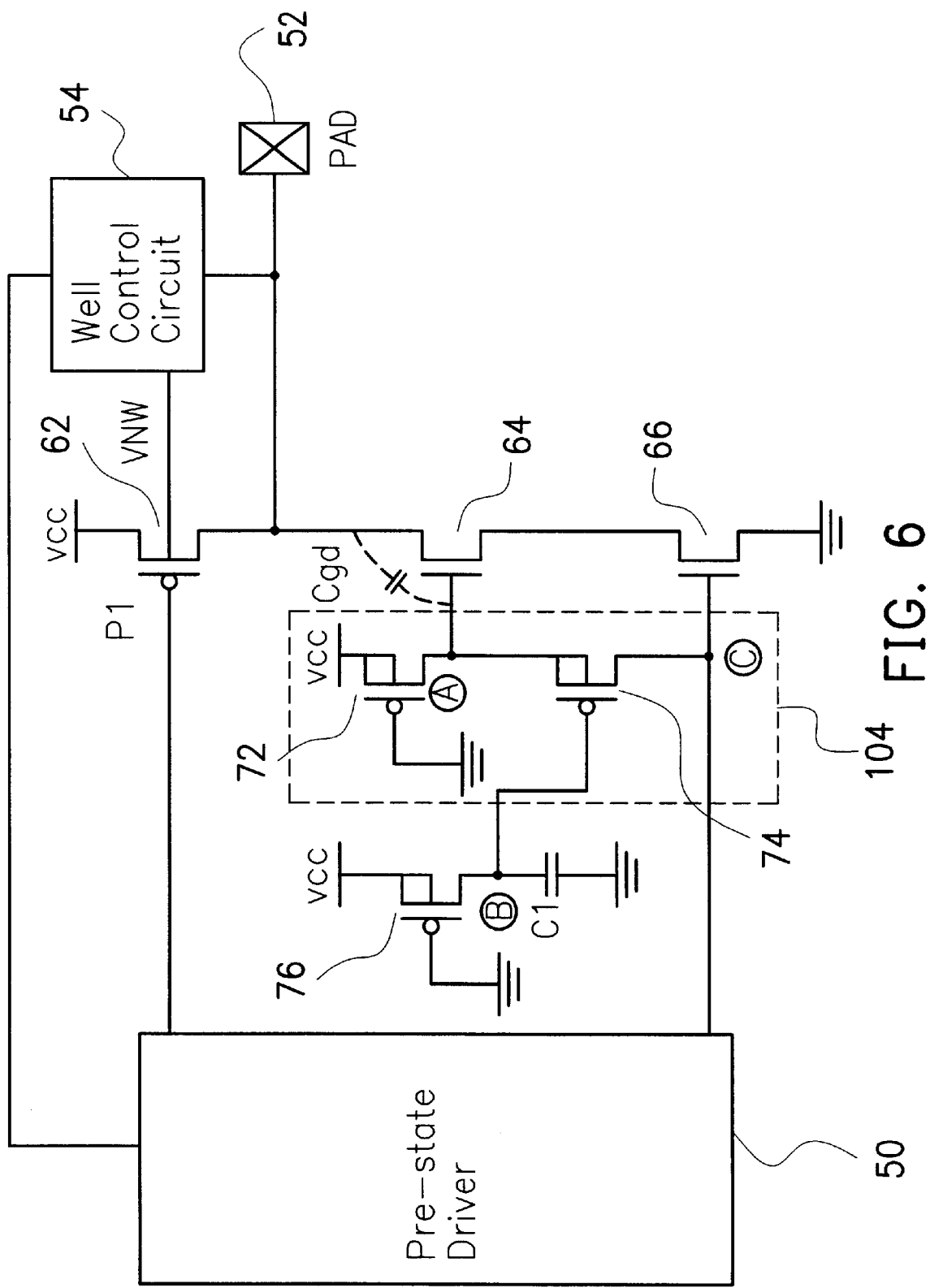
FIG. 6 is illustrating an ESD circuit, it is similar to FIG. 4, and it is another electrostatic discharge protective charge and protects the pre-stage driver, according to one preferred embodiment of this invention.

FIG. 6 shows another electrostatic discharge protective circuit to protect the pre-stage driver, which is similar to the circuit in FIG. 4. The different in between FIG. 4 through FIG. 6 is a MOS device that replaced by the resistor. The PMOS transistor 72 and 74 replace the resistors R2 and R1 respectively in FIG. 4. Also, a source/drain region of the PMOS transistor 72 connects to the system power source Vcc. The gate of the PMOS transistor 72 connects to the grounded node and the other source/drain region connects to the node A.

Similarly, the node B connects to the PMOS transistor 76 that also replaces another resistor. So, the protective loop 104 can process in the semiconductor procedure.

Figure 7:
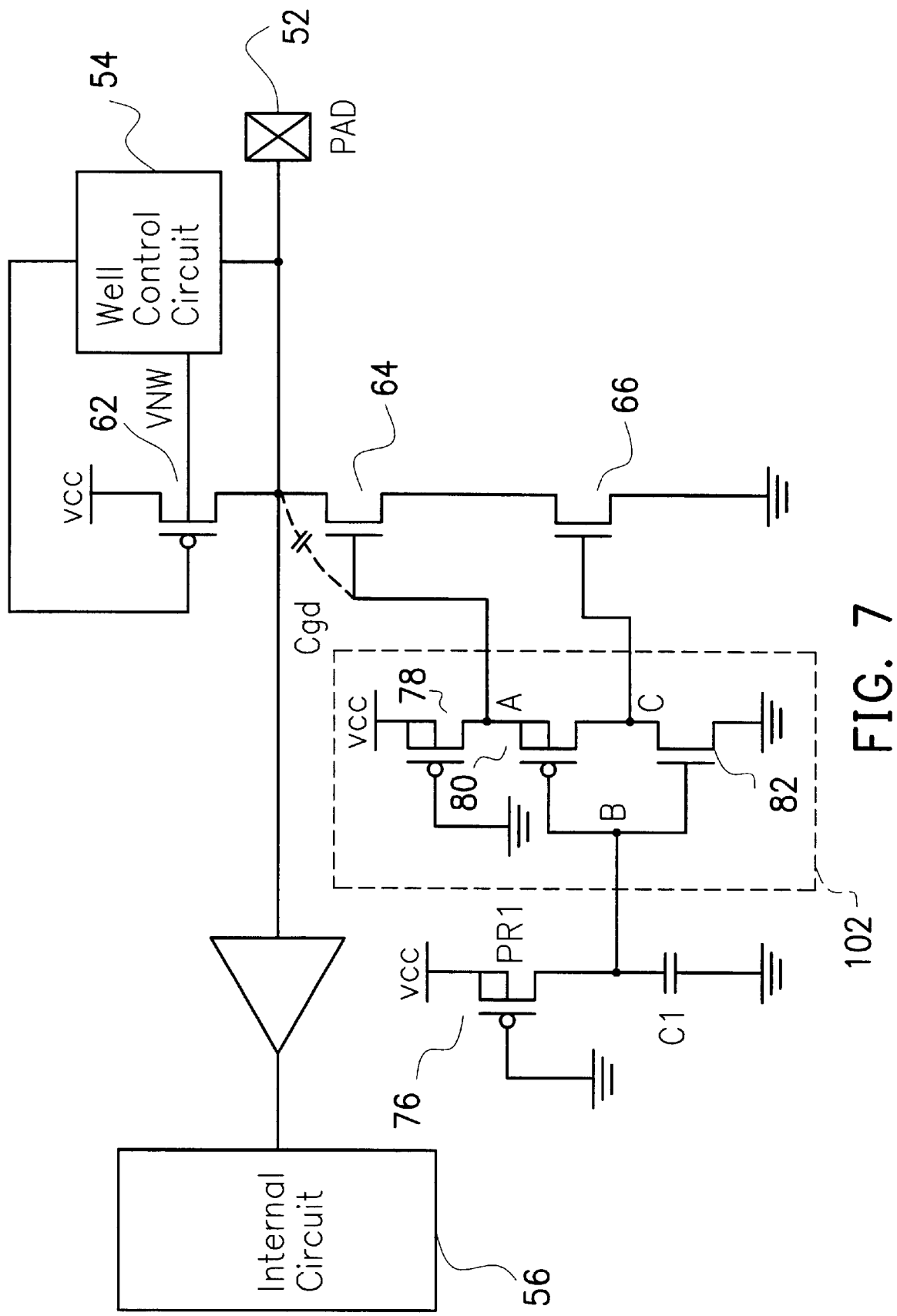
FIG. 7 is illustrating an ESD circuit, it is similar to the circuit in FIG. 5, and it is another electrostatic discharge protective charge and protects the internal circuit, according to one preferred embodiment of this invention.

FIG. 7 shows another electrostatic discharge protective circuit to protect the internal circuit that is similar to the circuit in FIG. 5. In the FIG. 7, the PMOS transistor 78 replaces the resistor R2 on the protective circuit 102 in FIG. 5. The connection as shows as above. The PMOS transistor 76 replaces the resistor R1. Also and, the protective circuit 102 can process in the semiconductor procedure.

Compare all the foregoing description, the circuit adds a protective loop by the proper connection, he electrostatic can turned "ON" the NMOS 64 and 66 in order, therefore it can have more validity to discharge the electrostatic.

In this invention, it can improve the electrostatic protective ability for some conventional design of the electrostatic discharge protective circuit. The circuits of this invention can compatible the conventional design the electrostatic discharge protective circuit. In this invention, the MOS device is designed the conductivity state circuit for its property. For example, when the P-type and N-type transistors replace each other and the circuit can redesign and adjust the circuit structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An output buffering circuit serving as an electrostatic discharge (ESD) protective circuit, comprising:

a first P-type metal-oxide semiconductor (PMOS) transistor, a first N-type metal-oxide semiconductor (NMOS) transistor, and a second NMOS transistor connected in series, wherein a first source/drain region of the first PMOS transistor, a second source/drain region and a gate respectively connect to a system power source, a conductive pad, and a first output of the pre-stage device;

a gate of the first NMOS transistor connects to a first node A, a gate of the second NMOS transistor connects to a third node C, a source/drain region the second NMOS transistor connects to a grounded node, the third node C receives the pre-stage device of a second output;

a first resistor, connecting between the first node A and the system power source;

a second PMOS transistor, connecting between the first node A and the third node C, and a substrate of the second PMOS transistor also connect to the first node A, the other second PMOS transistor of a gate connect to a second node B;

a second resistor, connecting between the second node B and the system power source; and a capacitor, connecting between the second node B and the grounded node.

2. The output buffering circuit of claim 1, wherein the first resistor comprises a metal-oxide semiconductor resistor that builds by a third PMOS transistor, wherein a first source/drain region of the third PMOS transistor, a second source/drain region and a gate respectively connect to a system power source, the first node A and the grounded node.

3. The output buffering circuit of claim 1, wherein the second resistor comprises a metal-oxide semiconductor resister that builds by a fourth PMOS transistor, wherein a first source/drain region of the forth PMOS transistor, a second source/drain region and a gate respectively connect to a system power source, the second node B and the grounded node.

4. The output buffering circuit of claim 1, must connecting with a well control circuit, wherein the well control circuit connects the conductive pad and a substrate of the first PMOS transistor.

5. The output buffering circuit of claim 1, wherein the pre-stage device comprises a pre-stage driver, and a terminal of the pre-stage device is connected to a well control circuit.

* * * * *